United States Patent
Miller et al.

(10) Patent No.: US 7,218,130 B2
(45) Date of Patent: May 15, 2007

(54) BOTTOM SIDE STIFFENER PROBE CARD

(75) Inventors: Deborah Miller, Meridian, ID (US); Gail Fenwick, Boise, ID (US); Daniel Strittmatter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/925,260

(22) Filed: Aug. 25, 2004

(65) Prior Publication Data

US 2006/0043984 A1     Mar. 2, 2006

(51) Int. Cl.
    *G01R 1/073*     (2006.01)
    *H01R 43/00*     (2006.01)

(52) U.S. Cl. .................. 324/762; 29/854; 324/754

(58) Field of Classification Search ............ 324/758, 324/765, 754, 158.1, 763, 761, 72.5
See application file for complete search history.

(56) References Cited

U.S. PATENT DOCUMENTS

| | | | | |
|---|---|---|---|---|
| 3,835,381 A | * | 9/1974 | Garretson et al. | 324/762 |
| 3,999,860 A | * | 12/1976 | Demsky et al. | 356/402 |
| 4,563,640 A | * | 1/1986 | Hasegawa | 324/762 |
| 4,567,433 A | * | 1/1986 | Ohkubo et al. | 324/762 |
| 4,780,670 A | * | 10/1988 | Cherry | 324/754 |
| 4,837,622 A | * | 6/1989 | Whann et al. | 324/754 |
| 5,382,898 A | * | 1/1995 | Subramanian | 324/754 |
| 5,422,574 A | * | 6/1995 | Kister | 324/754 |
| 5,583,445 A | * | 12/1996 | Mullen | 324/753 |
| 5,917,330 A | * | 6/1999 | Miley | 324/762 |
| 5,949,244 A | * | 9/1999 | Miley | 324/762 |
| 6,064,215 A | * | 5/2000 | Kister | 324/754 |
| 6,426,636 B1 | * | 7/2002 | Das et al. | 324/754 |
| 6,515,358 B1 | * | 2/2003 | Dass et al. | 257/684 |
| 6,603,322 B1 | * | 8/2003 | Boll et al. | 324/754 |

* cited by examiner

*Primary Examiner*—Ernest Karlsen
(74) *Attorney, Agent, or Firm*—Dickstein Shapiro LLP

(57) ABSTRACT

A probe card for production testing of semiconductor imaging die includes a stiffener supported on a bottom side of the probe card. The top of the stiffener is substantially flush with a top surface of the probe card. A light passage through the stiffener features non-reflective surfaces. Surfaces surrounding the light passage are arranged to avoid casting any shadows on the imaging die being tested. The arrangement provides a low profile probe card. A source of light used to illuminate the imaging die through the light passage can be placed close to the imaging device under test, providing few false negatives and more consistent results from wafer to wafer.

21 Claims, 8 Drawing Sheets

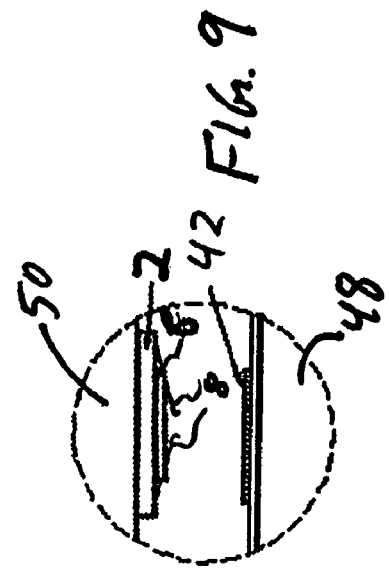
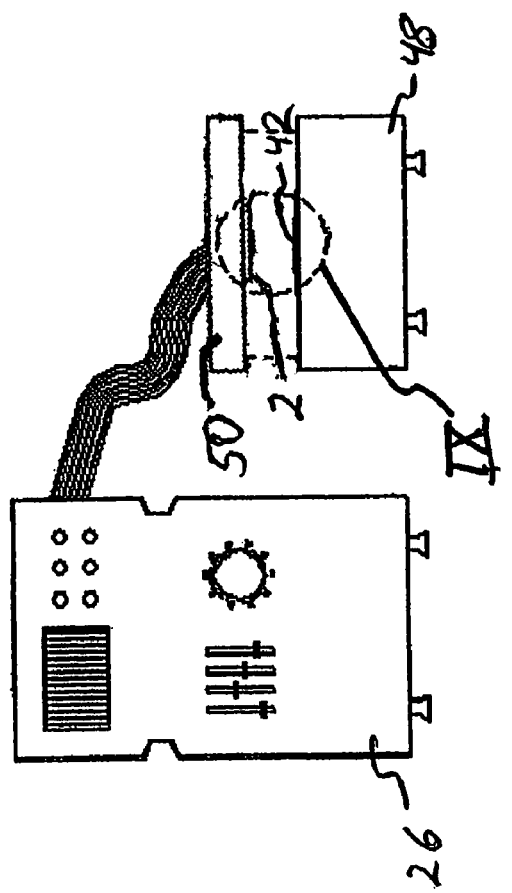

BOTTOM SIDE STIFFENER PROBE CARD

BACKGROUND OF THE INVENTION

1. Field of the Invention

The invention relates to testing of integrated circuits using probe cards, and more particularly to bottom side stiffeners for probe cards used in production testing of wafers containing imaging die.

2. Description of the Related Art

Semiconductor integrated circuits (ICs) are produced extensively and are used in a vast number of products. As semiconductor ICs become increasingly smaller and production levels increase, testing of the ICs becomes more difficult, and more critical.

ICs are mass-produced on round, thin sheets of semiconducting material referred to as wafers. Wafers most commonly are made of silicon. Anywhere from 50 to 200 or more identical circuits, or die, can be produced in a single wafer. Each circuit is provided with contacts, such as peripheral pads, to connect the circuit die with other components or circuits. Testing devices need to make connections with the circuits of each individual die by engaging the contacts. Rather than testing each die on a wafer one at a time, the testing devices typically test several die at once. All of the die are tested by moving the wafer under test relative to the fixed probe card of the testing device in a sequential testing pattern. On a wafer with 200 circuit die, for example, a testing device that tests four die at once will use a pattern of at least 50 moves to cover the entire wafer. Thus, the connections made by the probes on a probe card of a testing device with the die contacts must be made repeatedly and reliably for each of hundreds of wafers in a production batch, for example.

In addition to making reliable connections with each die, active testing of imaging die also requires illuminating each die using a light source. In order to achieve consistent active testing from die to die and wafer to wafer, the illumination must be constant and evenly distributed onto each of the several die being tested. In the example above, for instance, the illumination provided to each of the four die being tested simultaneously must be as consistent as possible. In the past, stiffeners provided on the top side of probe cards for imaging die have contributed to inconsistent lighting during testing, which has lead to inconsistencies and false-negative results.

Thus, there is a need and desire for a probe card for imaging die provided with a stiffener which allows consistent lighting of the imaging die during active production testing.

BRIEF SUMMARY OF THE INVENTION

An exemplary embodiment of the invention provides a probe card for production testing of semiconductor imaging die. The probe card includes a stiffener supported on a bottom side of the probe card, nearest the imaging die being tested. The top of the stiffener is substantially flush with a top surface of the probe card. A light passage through the stiffener is provided with non-reflective surfaces. Surfaces surrounding the light passage are arranged to minimize the casting of any shadows on the imaging die being tested. The arrangement provides a low profile probe card. A light source shining through the passage in the stiffener can be placed close to the imaging die for use during active testing, providing few false negatives and more consistent results from wafer to wafer.

BRIEF DESCRIPTION OF THE DRAWINGS

The above-described features and advantages of the invention will be more clearly understood from the following detailed description, which is provided with reference to the accompanying drawings in which:

FIG. 8 illustrates a wafer tester according to an exemplary embodiment of the invention; and FIG. 9 is an enlarged view of section IX of the wafer tester illustrated in FIG. 8.

DETAILED DESCRIPTION OF THE PREFERRED EMBODIMENTS

Figure 1:
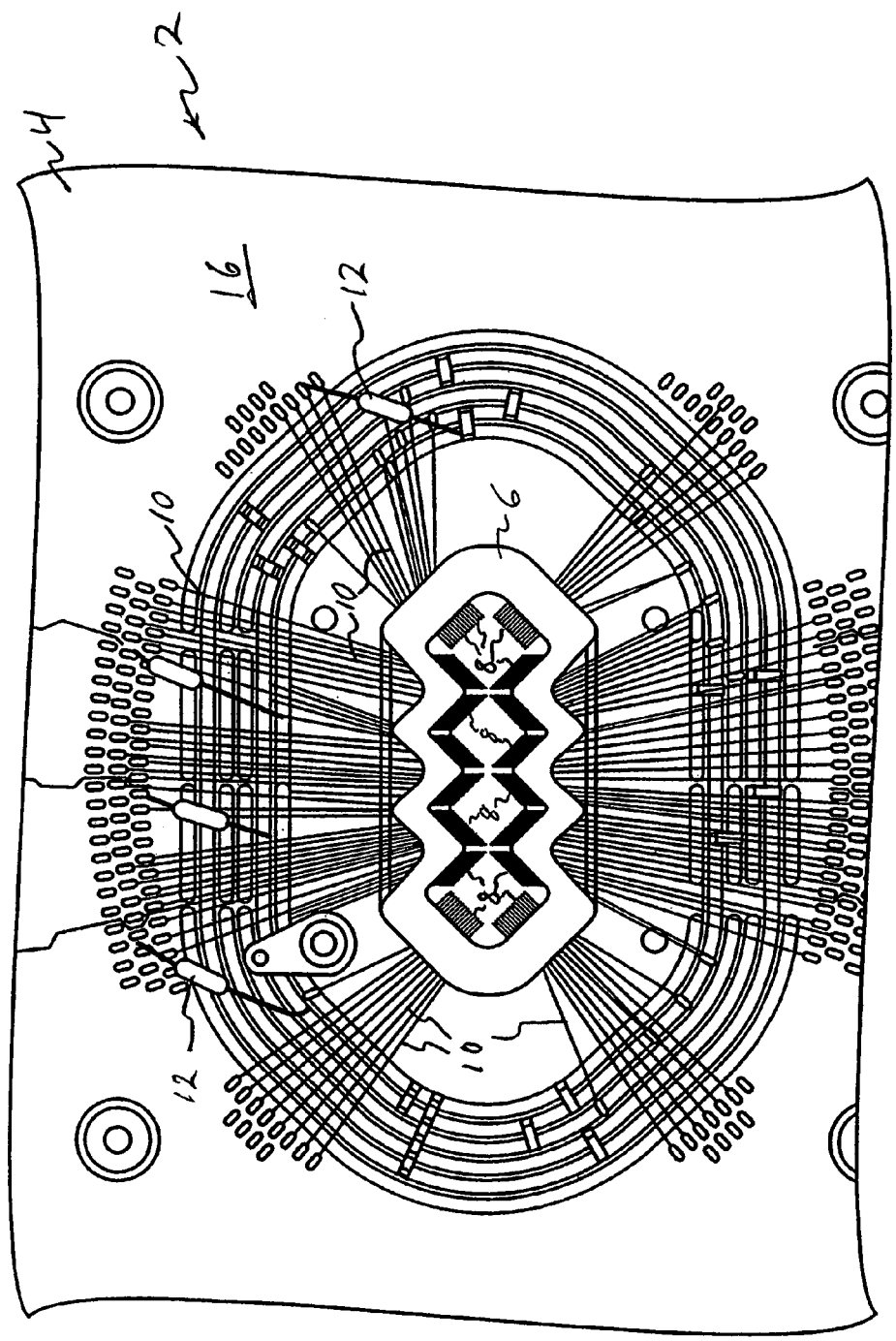
FIG. 1 is a bottom side plan view of a portion of a probe card according to an exemplary embodiment of the invention.

Referring to FIGS. 1–9, a probe card 2 according to an exemplary embodiment of the invention includes a printed circuit board 4 having a central opening framed by a stiffener 6. A plurality of probes 8 are supported by the stiffener 6. The probes 8 are arranged to contact peripheral pads formed on imaging die in a silicon wafer, as described further below. The probes are secured to the stiffener 6 by a layer of adhesive, such as epoxy 7. Individual probes 8 are connected by leads 10 to circuitry provided on the printed circuit board 4. Portions of the probes and their connections to leads 10 are encased in epoxy 7, as indicated for representative probes by broken lines 9. Some of the circuitry, which is not shown in detail in the Figures, includes discrete components such as capacitors 12.

Figure 2:
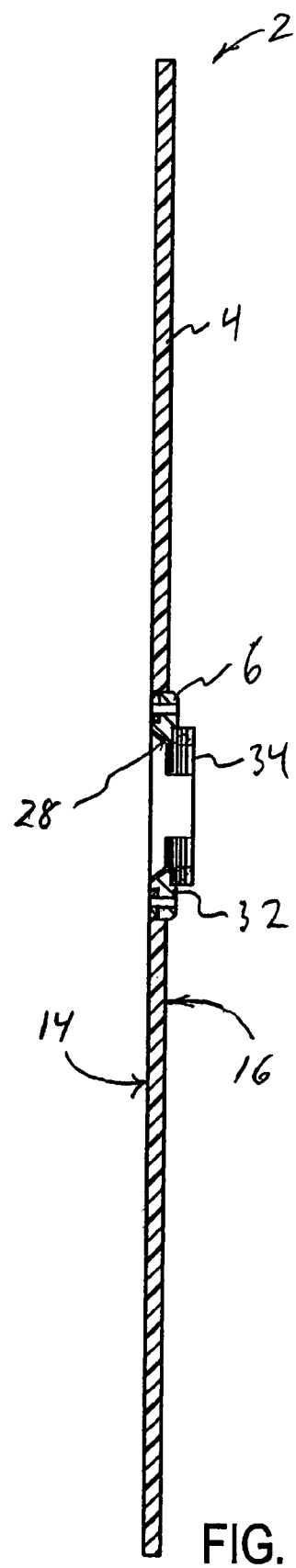
FIG. 2 is a cross-section of a probe card taken along the line II—II of FIG. 3 according to an exemplary embodiment of the invention.

Referring to FIG. 2, the probe card 2 is shown in cross-section. The printed circuit board 4 includes a top side 14 and a bottom side 16. The stiffener 6 is disposed substantially flush with the surface of the top side 14 of printed circuit board 4. The stiffener 6 includes a metal frame 32, an axially-extending portion of which fits into a recess formed in the bottom side 16 of printed circuit board 4. The stiffener also includes a ceramic ring 34. The ceramic ring 34 fits into a recess formed in the bottom side of frame 32. The interfitting of the printed circuit board 4, the frame 32, and the ceramic ring 34 provides the probe card with a narrow profile.

Figure 3:
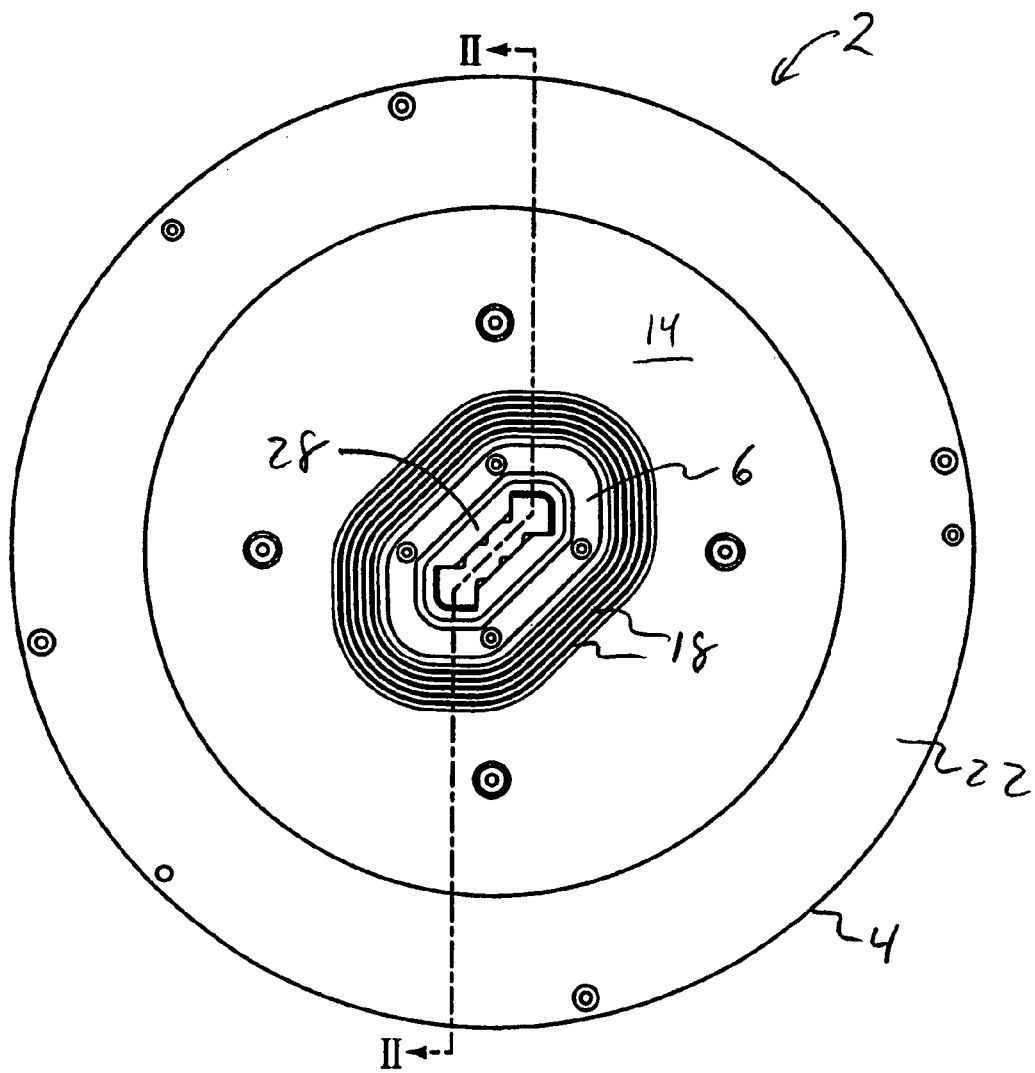
FIG. 3 is a top plan view of a probe card according to an exemplary embodiment of the invention.

Referring to FIG. 3, the top side 14 of printed circuit board 4 is shown in plan view. The top side 14 of printed circuit board 4 includes conductive traces 18 shown schematically around an opening 20 (FIG. 5) into which stiffener 6 is installed. The traces 18 are used to interconnect probe card circuit components (not shown). The top side 14 of the printed circuit board 4 includes wire openings and other traces not shown in the Figures for the sake of clarity. In particular, a plurality of connector pads is disposed in outer circuit board ring 22 for interlinking with a computerized (micro-processor based) IC tester 26 (illustrated in FIG. 8). Surface 28 of stiffener 6 is treated to reduce light reflection and scattering. According to an exemplary embodiment, surface 28 is formed of an epoxy that is black in color. The epoxy surface is roughened to give it a coarse texture, for example, to provide a non-reflective surface and minimize light reflection.

Figure 4:
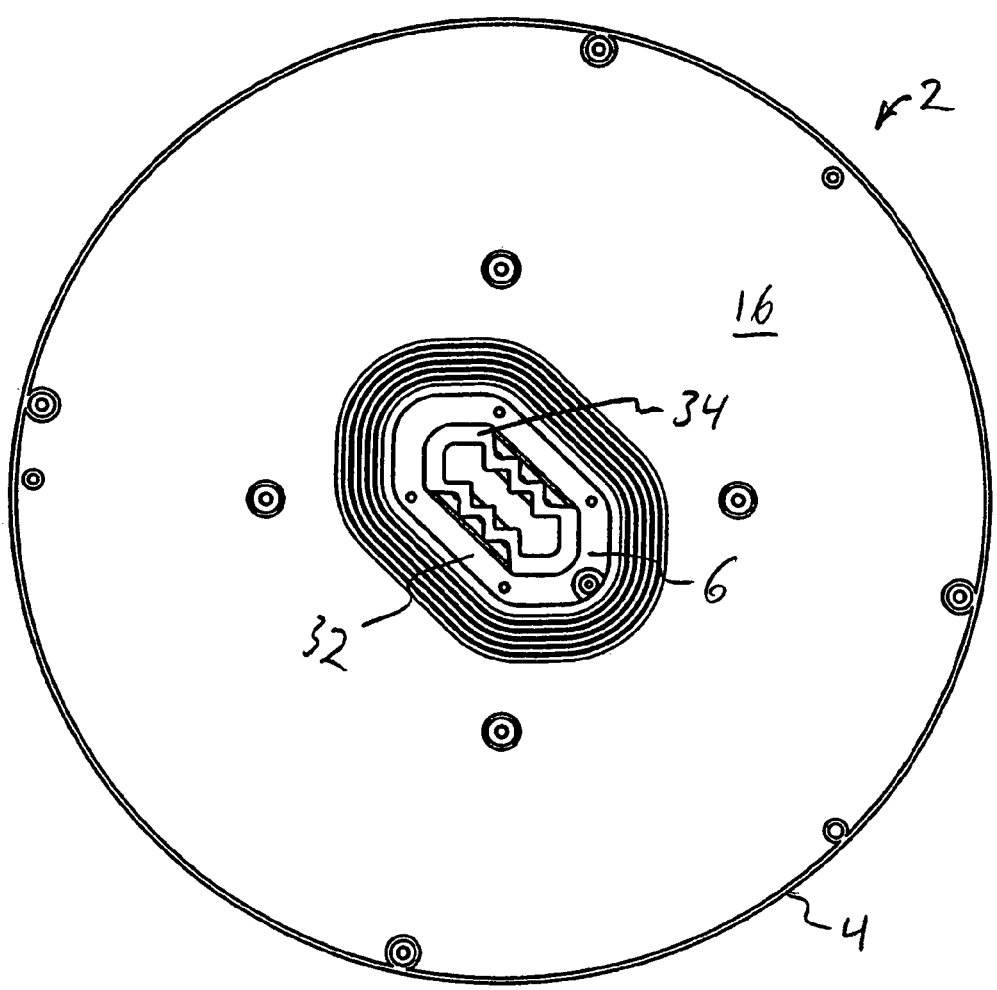
FIG. 4 is a bottom plan view of a probe card according to an exemplary embodiment of the invention.

FIG. 4 illustrates the bottom side 16 of the printed circuit board 4 and the bottom of stiffener 6 shown in plan view. As in FIG. 3, various interconnects, components, and traces are not shown for the sake of clarity. The bottom side of frame 32 supports ceramic ring 34, upon which probes 8 (FIG. 1) are supported. Probes 8 are not shown in FIG. 4 for clarity of illustration purposes.

Figure 5:
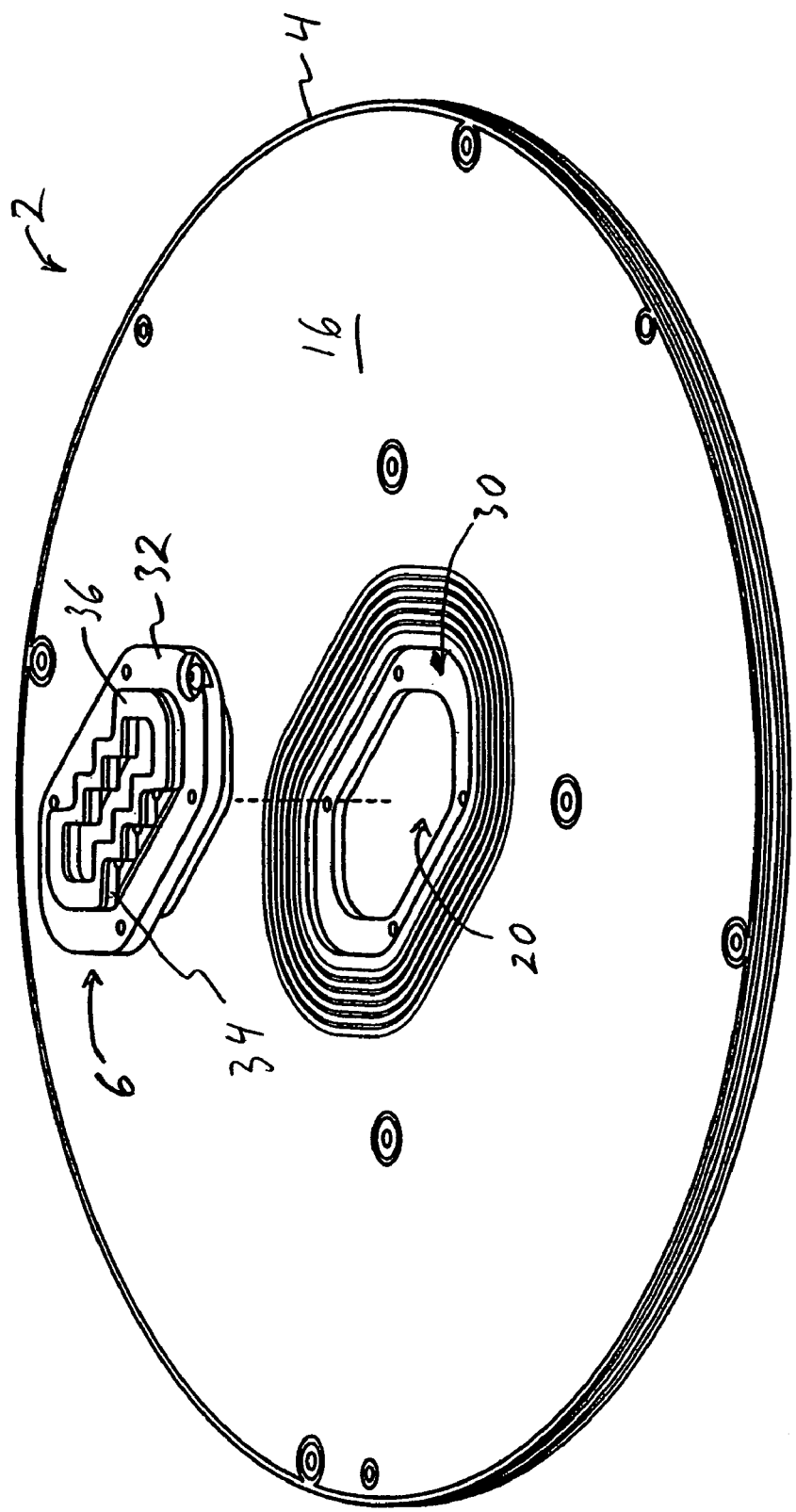
FIG. 5 is an exploded view of a stiffener being assembled to the bottom side of a probe card according to an exemplary embodiment of the invention.

Referring to FIG. 5, a step in the assembly of the stiffener 6 to the printed circuit board 4 is illustrated according to an exemplary embodiment of the invention. The stiffener 6 is installed into the opening 20 from the back side 16 of printed circuit board 4. A relief 30 is formed in printed circuit board 4 to receive the stiffener 6. Stiffener 6 includes the metal frame 32 supporting the ceramic ring 34. The ring 34 can be formed of any material that is an electrical insulator capable of withstanding temperatures up to as high as about 200° C. (~392° F.). In an exemplary embodiment, the ring 34 is formed of layers of ceramic material. Advantageously, the ceramic material is sturdy and has a coefficient of expansion similar to that of the material (silicon) used to form the printed circuit board 4.

An adhesive layer, such as epoxy 36, holds probes 8 (FIGS. 1 and 8) in place on ceramic ring 34. Epoxy 36 is sturdy, electrically non-conductive, and able to withstand high temperatures. In addition, epoxy 36 adheres well to both the ceramic ring 34 and the probes 8, in order to secure the probes in position.

Figure 6:
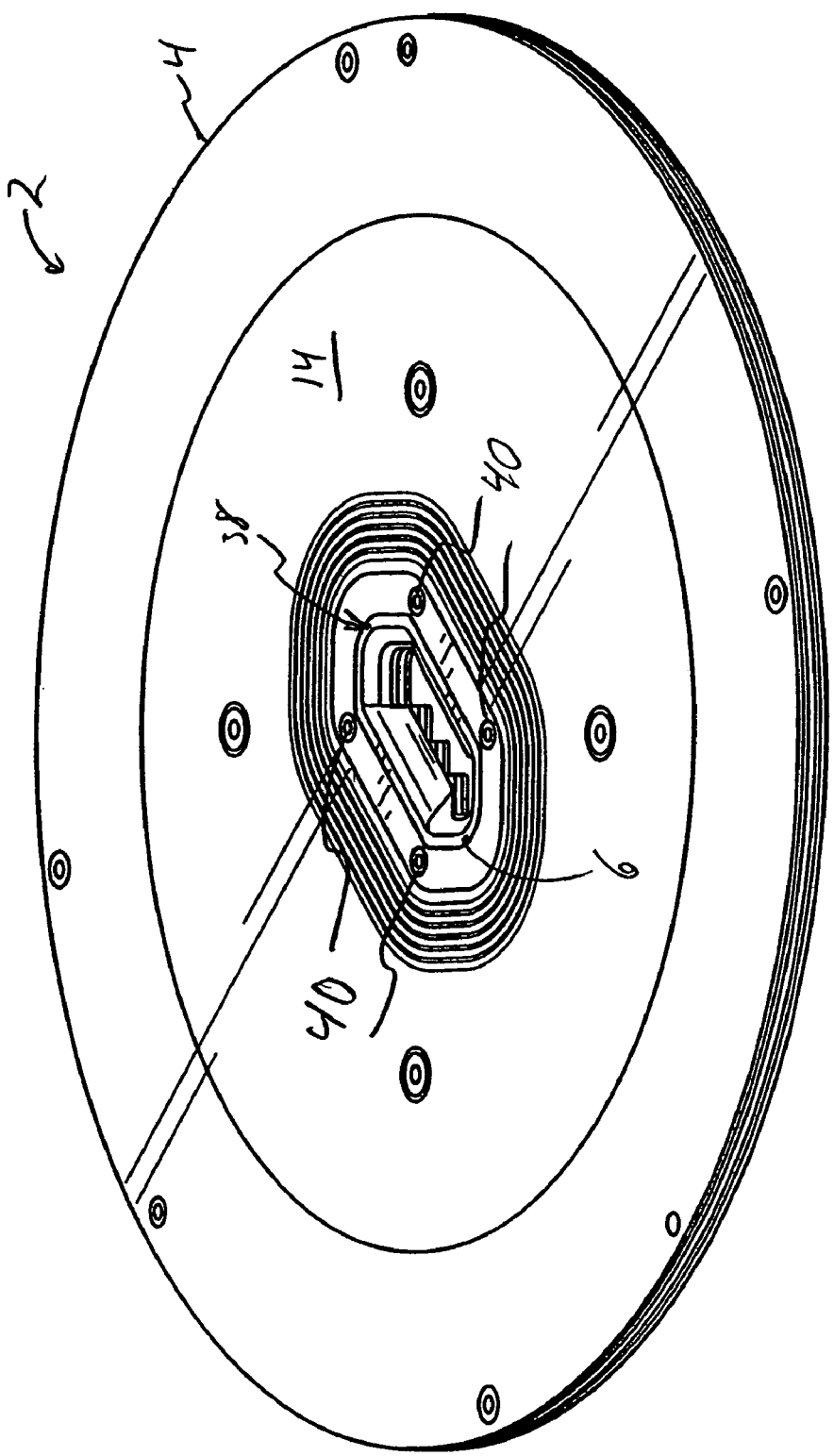
FIG. 6 is a perspective view of the top side of a probe card according to an exemplary embodiment of the invention.

FIG. 6 illustrates the top side 14 of the probe card 2, with the stiffener 6 assembled to the printed circuit board 4 as discussed above in connection with FIG. 5. A top surface 38 of stiffener 6 is substantially flush with the surface of top side 14 of circuit board 4. The stiffener 6 is attached to the probe card 4 at attachment points 40.

Figure 7:
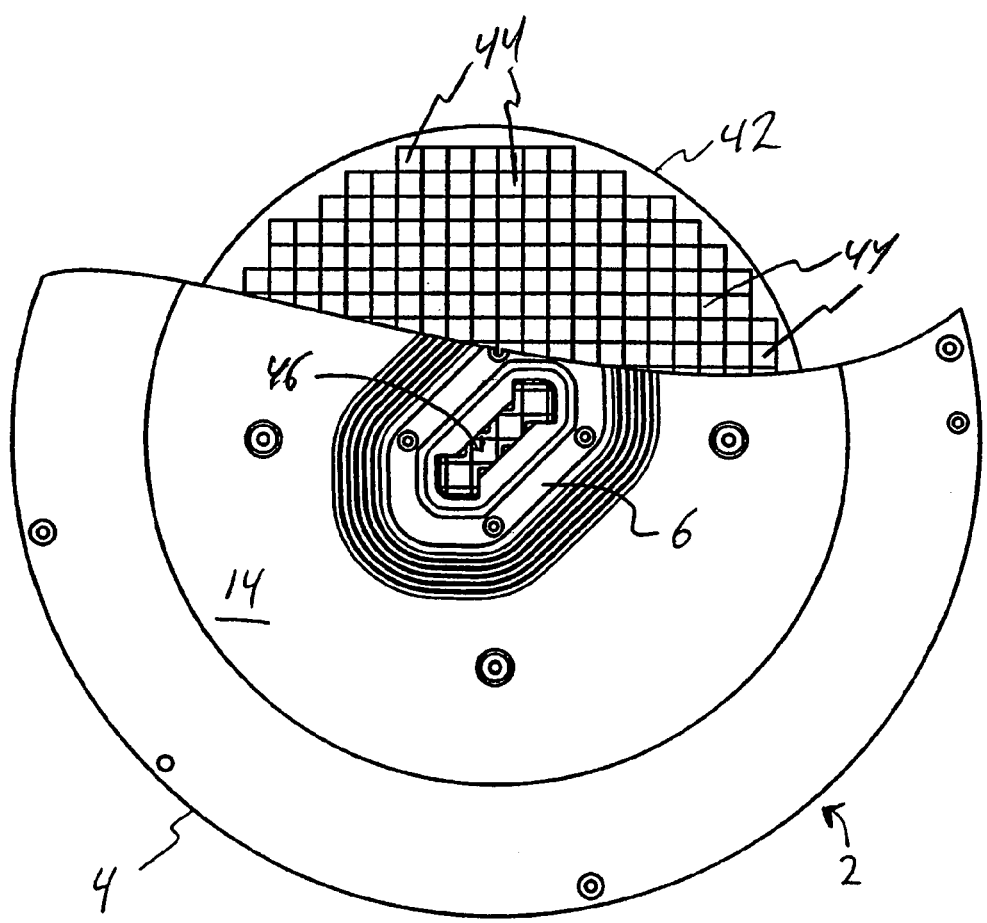
FIG. 7 is a cut-away plan view of a probe card being used to test an imaging die wafer according to an exemplary embodiment of the invention.

Referring to FIG. 7, a method of testing a wafer 42 using probe card 2 is now explained. The probe card 2 is shown with a portion cut away to reveal the wafer 42. The wafer 42 contains a plurality of imaging die 44. The wafer 42 is positioned under the probe card 2, and a passage 46 through the stiffener is aligned over four of the imaging die 44. The wafer 42 under test is advanced with respect to the probe card 2 such that the probes 8 (shown in FIGS. 1, 8, and 9) contact peripheral pads on each of the four imaging die 44. With the probe card 2 in place, four imaging die 44 can be tested simultaneously. Tests take place under light and dark conditions, as described further below. The passage 46 and its surrounding surfaces are arranged such that shadowing is minimized on the four imaging die 44 (e.g., by light projected through the passage 46 during active testing). Once a set of four die have been tested and the results recorded, the wafer 42 is moved relative to the probe card 2 so that the passage 46 is aligned with another set of four imaging die 44. The process is repeated until each of the die 44 on the wafer 42 is tested.

FIGS. 8 and 9 illustrate an integrated circuit tester 26 interconnected to the probe card 2. The wafer 42 is placed on a prober chuck 48. A prober chuck 48 is arranged to advance the wafer 42 toward the probe card 2 on probe card support 50 to bring probes 8 into contact with peripheral pads on the four imaging die 44. A light source (not shown) is provided in probe card support 50 for shining light through passage 46 in stiffener 6 onto the imaging die 44 to be used in active tests requiring illumination. Advantageously, the light source can be placed close to the top side 14 of the printed circuit board 2, and closer to the imaging die 44 than in other probe card arrangements, because the top of the stiffener 6 is substantially flush with the top side 14 of the printed circuit board 2. Placing the source of light closer to the imaging die under test provides few false negatives and more consistent results from wafer to wafer. The light source may be fitted with a diffuser to enhance a more even distribution of light illuminating the imaging die. The stiffener 6 is arranged to minimize or eliminate shadows cast by the light onto the imaging die.

Various applications of the devices and methods of the invention will become apparent to those of skill in the art as a result of this disclosure. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A probe card comprising:
a printed circuit board having a first side and a second side, the second side arranged to face a device to be tested, the printed circuit board defining a first opening through the printed circuit board; and
a stiffener disposed on the printed circuit board in the first opening and having a surface facing the second side of the printed circuit board;
said stiffener comprising:
a frame having a second opening, a portion of said frame extending axially into said first opening; and
a ceramic ring extending axially into said second opening.

2. A probe card as in claim 1, wherein the frame secures the ceramic ring to the second side of the printed circuit board.

3. A probe card as in claim 1, wherein the printed circuit board includes a recess formed on the second side and partially into the printed circuit board for receiving a portion of the frame.

4. A probe card as in claim 1, wherein a portion of the stiffener extends axially into the opening to be substantially flush with the first side of the printed circuit board.

5. A probe card as in claim 1, wherein at least an inner portion the stiffener is covered with a non-reflective coating.

6. A probe card as in claim 1, wherein portions of the stiffener include epoxy having a non-reflective surface.

7. A probe card as in claim 6 wherein the non-reflective surface has a coarse texture.

8. A probe card as in claim 1, wherein the stiffener defines a central passage to allow light to project through the probe card onto the device under test.

9. A probe card as in claim 1, further comprising capacitors disposed on the second side of the printed circuit board.

10. A probe card as in claim 1, wherein a thickness of the stiffener portion extending into the printed circuit board at the central opening is substantially equal to a thickness of the printed circuit board.

11. A probe card as in claim 1, wherein a portion of the stiffener engages a complementary cut-out formed in the second side of the printed circuit board.

12. A probe card as in claim 1, wherein a passage defined through the stiffener for light applied from the first side to the second side is wider in profile on a light-entering side than on a light-exiting side.

13. A test apparatus comprising:
   a printed circuit board having a first side and a second side, the second side being arranged to face a wafer containing imaging die to be tested, the printed circuit board formed to define a first opening through the printed circuit board;
   a stiffener framing the first opening in the printed circuit board and forming a passage therethrough, said stiffener comprising:
      a frame having a second opening, a portion of said frame extending axially into said first opening; and
      a ceramic ring extending axially into said second opening;
   the stiffener having a surface facing the second side of the printed circuit board; and
   probes supported by the stiffener and electrically connected to circuitry on the printed circuit board.

14. A test apparatus as in claim 13, wherein the probes are supported on the ceramic ring.

15. A test apparatus as in claim 14, wherein the ceramic ring has a coefficient of expansion substantially equal to a coefficient of expansion of the wafer.

16. A test apparatus as in claim 13, further comprising a light source arranged to shine through the passage formed by the stiffener.

17. A tester for imager chips formed on a wafer comprising:
   a printed circuit board having a first side and a second side, the second side arranged to face a device to be tested, the printed circuit board formed to define a central opening;
   a stiffener abutting the second side of the printed circuit board and framing the central opening, said stiffener comprising:
      a frame having a second opening, a portion of said frame extending axially into said central opening; and
      a ceramic ring extending axially into said second opening;
   the stiffener having a surface facing the second side of the printed circuit board;
   probes supported by the stiffener and electrically connected to circuitry on the printed circuit board; and
   a microprocessor-based computer interconnected with the circuitry on the printed circuit board.

18. A method of testing imager chips comprising:
   supporting a wafer containing a plurality of imaging die;
   advancing a wafer into probe card contact with at least one of the imaging die, the probe card including a printed circuit board having a central opening and a stiffener disposed in the central opening on a second side of the printed circuit board, the stiffener having: a surface facing the second side of the printed circuit, a frame having a second opening, a portion of said frame extending axially into said central opening, and a ceramic ring extending axially into said second opening; and
   illuminating the at least one imaging die with a light directed through the central opening.

19. A method as in claim 18, wherein light is directed through the central opening so as to cast substantially no shadow on the at least one of the imaging die.

20. A method of manufacturing a probe ring comprising:
   developing a printed circuit board to define first opening through the printed circuit board, the printed circuit board having a first side and a second side;
   forming a recess in the second side of the printed circuit board around the first opening; and
   installing and seating a stiffener into the recess formed in the second side of the printed circuit board, said stiffener comprising:
      a frame having a second opening, a portion of said frame extending axially into said first opening; and
      a ceramic ring extending axially into said second opening;
   the stiffener having a profile formed complementary to a shape of the recess and a surface facing the second side of the printed circuit board.

21. A method as in claim 20, further comprising supporting test probes on a ceramic ring supported by the stiffener.

* * * * *

UNITED STATES PATENT AND TRADEMARK OFFICE
CERTIFICATE OF CORRECTION

| | | |
|---|---|---|
| PATENT NO. | : 7,218,130 B2 | Page 1 of 1 |
| APPLICATION NO. | : 10/925260 | |
| DATED | : May 15, 2007 | |
| INVENTOR(S) | : Deborah Miller et al. | |

It is certified that error appears in the above-identified patent and that said Letters Patent is hereby corrected as shown below:

Column 4, line 51, "portion the" should read --portion of the--.

Signed and Sealed this

Thirty-first Day of July, 2007

JON W. DUDAS
*Director of the United States Patent and Trademark Office*